(12) United States Patent
Aaltonen et al.

(10) Patent No.: US 7,970,369 B2
(45) Date of Patent: Jun. 28, 2011

(54) RECEIVING DEVICES

(75) Inventors: Janne Aaltonen, Turku (FI); Pekka Talmola, Turku (FI)

(73) Assignee: Nokia Corporation, Espoo (FI)

( * ) Notice: Subject to any disclaimer, the term of this patent is extended or adjusted under 35 U.S.C. 154(b) by 753 days.

(21) Appl. No.: 11/921,701

(22) PCT Filed: Jun. 7, 2005

(86) PCT No.: PCT/IB2005/051852
§ 371 (c)(1),
(2), (4) Date: Dec. 6, 2007

(87) PCT Pub. No.: WO2006/131788
PCT Pub. Date: Dec. 14, 2006

(65) Prior Publication Data
US 2009/0122204 A1 May 14, 2009

(51) Int. Cl.
*H04B 1/18* (2006.01)
(52) U.S. Cl. ............... 455/186.1; 455/67.11; 455/185.1
(58) Field of Classification Search ............... 455/185.1, 455/186.1, 2.01, 67.11
See application file for complete search history.

(56) References Cited

U.S. PATENT DOCUMENTS

| | | | | |
|---|---|---|---|---|
| 5,278,988 A * | 1/1994 | Dejean et al. | ............... | 455/2.01 |
| 6,424,816 B1 * | 7/2002 | Stephens | ................. | 455/2.01 |
| 6,748,215 B1 * | 6/2004 | Chen et al. | ............... | 455/179.1 |
| 7,161,896 B1 * | 1/2007 | Hart et al. | ............... | 455/186.1 |
| 7,457,596 B1 * | 11/2008 | Gerhaeuser et al. | ....... | 455/156.1 |
| 7,773,499 B2 * | 8/2010 | Hart et al. | ............... | 455/60 |
| 2005/0057698 A1 | 3/2005 | Bae | ........................... | 348/732 |
| 2010/0169375 A1 * | 7/2010 | Cumby et al. | ............... | 455/130 |

FOREIGN PATENT DOCUMENTS

EP 04 84246 A1 5/1992

* cited by examiner

*Primary Examiner* — Lana N Le
(74) *Attorney, Agent, or Firm* — Harrington & Smith (57) ABSTRACT

A network includes a service provider, a plurality of transmitters and a receiving device. The receiving device identifies the frequencies at which broadcast services are provided by a transmitter local to the receiving device. A search is carried out until a signal is received by the receiving device (S4.1). Then, the receiving device looks-up the transmitter (step S4.2). This involves searching the table 29 and identifying the row 30 that includes data corresponding to the frequency of the found signal. Optionally, it is determined whether or not there is only one candidate transmitter (step S4.3), by determining how many rows 30 in the table 29 include data corresponding to the frequency of the found signal. If there is more than one row, then the transmitter is disambiguated (step S4.4.).

16 Claims, 5 Drawing Sheets

| | Bundle TV1 | Bundle TV2 | Bundle MTV3 | Bundle 4 | Bundle SVT |
|---|---|---|---|---|---|
| Tervola | 3 | 22 | 25 | | |
| Vuokatti | 4 | 56 | 59 | | |
| Lapua | 5 | 24 | 40 | 48 | |
| Pyhätunturi | 5 | 32 | 24 | | |
| Anjalankoski | 5 | 49 | 56 | 41 | |
| Kuttanen | 5 | 60 | 50 | | |
| Espoo | 6 | 8 | 24 | 52 | 35 |
| Pyhävuori | 6 | 10 | 22 | | |
| Iisalmi | 6 | 22 | 29 | | |
| Taivalkoski | 6 | 23 | 35 | | |
| Utsjoki | 6 | 34 | 31 | | |
| Mikkeli | 6 | 38 | 28 | 54 | |
| Turku | 7 | 9 | 54 | 60 | 57 |
| Oulu | 7 | 11 | 33 | 37 | |
| Karigasniemi | 7 | 23 | 37 | | |
| Kruunupyy | 7 | 30 | 33 | | |
| Kuopio | 7 | 36 | 49 | 46 | |
| Vuotso | 8 | 35 | 28 | | |
| Koli | 8 | 51 | 57 | | |
| Tampere | 8 | 53 | 59 | 42 | |
| Haapavesi | 9 | 28 | 31 | | |
| Lahti | 9 | 40 | 51 | 48 | |
| Kerimäki | 9 | 55 | 58 | | |
| Posio | 10 | 30 | 27 | | |
| Pihtipudas | 10 | 32 | 43 | | |
| Joutseno | 10 | 32 | 60 | | |
| Tammela | 10 | 37 | 30 | | |
| Inari | 10 | 40 | 54 | | |
| Vaasa | 11 | 9 | 51 | 57 | |
| Jyväskylä | 11 | 25 | 35 | 41 | |
| Eurajoki | 11 | 33 | 36 | 55 | |
| Ylläs | 11 | 55 | 52 | | |
| Ähtäri | 26 | 39 | 29 | | |
| Fiskars | 31 | 41 | 58 | | 23 |
| Kiihtelysvaara | 35 | 41 | 38 | | |
| Ruka | 36 | 28 | 51 | | |
| Pernaja | 39 | 36 | 55 | | 26 |
| Roveniemi | 53 | 56 | 49 | | |

Fig. 6

RECEIVING DEVICES

FIELD OF THE INVENTION

The present invention relates to a method of operating a receiving device in a network, and to a receiving device.

BACKGROUND OF THE INVENTION

The organisation and operation of radio networks is regulated by authorities. In the UK, a region of the ultra high frequency (UHF) band is reserved for broadcasting, in particular for terrestrial television broadcasts. This band is shared between analogue and digital broadcasts.

The UHF band is conveniently divided up into channels. According to one existing system, each channel corresponds to an 8 MHz region of the UHF band at a particular centre frequency. Each channel is represented by a channel number from 21 to 68. For example, in the UK, channel number 21 represents an 8 MHz band having a centre frequency of 474 MHz. Similarly, channel number 22 represents a centre frequency of 482 MHz, channel number 23 represents a centre frequency of 490 MHz, and so on. A different portion of the radio spectrum is divided into channels used for radio (i.e. audio) broadcasts. Channel numbering and frequencies may vary between different countries and authorities.

The operation of radio networks is regulated. Therefore, information indicating which channel numbers are in use may be available. The information may also indicate the relationship between a particular channel number and its corresponding frequency. This information is usually referred to as a "frequency plan" of a country.

When a user turns on receiving device, they may not know which networks and/or television channels, or bundles, are available and at which frequencies, or channel numbers, these television channels are transmitted. Thus, it is usually necessary to perform a signal search.

It is particularly important to perform a signal search quickly and efficiently when a receiving device moves between the coverage of two different transmitters, a so-called "handover". As the user moves between the coverage of one transmitter to another, they may "lose" a signal and need to find a replacement signal. If a search for replacement signals is performed automatically, a user can experience substantially uninterrupted viewing of a particular television channel following a handover.

It is possible to provide information frequencies, or channel numbers, at which television channels are transmitted in a certain network. This information may be provided in service announcements, such as in an NIT or equivalents thereof.

In a DVB-H network, plural television channels are multiplexed into a single signal. In addition to the plural television channels, the signal may also carry radio programmes and data services. Thus, upon receiving a multiplexed signal, a user can provided with plural television channels and/or radio programmes by simply tuning to a single frequency or channel number.

As an example of the present situation in Finland, a signal can carry one of three bundles: Bundle A, Bundle B and Bundle C. Bundle A contains five digital television channels, TV1-D and TV2-D, FST, YLE24 and YLE Teema, and four radio programmes, YLE Classic, YLE Radio Peili, YLEQ, YLE Radio Vega+, some of which are transmitted simultaneously at FM frequencies. TV1-D and TV2-D are simultaneously transmitted in analogue form.

Table 1 below shows which Finnish television channels and radio programmes are included in Bundles A, B and C.

TABLE 1

| | Bundle A | Bundle B | Bundle C |
|---|---|---|---|
| Television channels | TV1-D, TV2-D, FST, YLE24, YLE Teema | MTV3, MTV3+, Subtv, Nelonen, Nelonen Plus | CANAL + Finland (m), CANAL + FILM1 (m), CANAL + FILM2 (m), CANAL + Sport (m), Sports channel |
| Regional television channels | — | — | Turku TV (In Turku area), TVT Lahti (in Lahti area) and Kuopion Alue-TV (in Kuopio area) |
| Radio programmes | YLE Classic, YLE Radio Peili, YLEQ, YLE Radio Vega+ | — | KissFM, POP |

MTV3, Subtv and Nelonen are also transmitted on an analogue network. CANAL channels are also transmitted on a satellite network. Thus, by tuning to a frequency or channel number corresponding to a signal that carries Bundle A, the user may choose between five television channels and four radio programmes.

Most countries requite transmitters at least two locations in order to provide reasonable coverage throughout the country. Transmitters at different locations generally transmit the same television channels at different frequencies, i.e. on different channel numbers, so as to minimise interference. Thus, it is usually necessary to perform a signal search each time a user leaves the coverage area of one transmitter and enters the coverage area of another transmitter. One way in which to do this is to perform a signal search across the entire frequency range.

However, performing a full signal search can be time consuming, especially when many channels are spread over a wide bandwidth. It can also constitute a significant drain of the power resources of a mobile device, thereby potentially reducing the interval between battery recharges.

SUMMARY OF THE INVENTION

According to a first aspect of the invention there is provided a method of operating a receiving device in a network in which signals are broadcast at a plurality of different frequencies, the receiving device or a server including memory arranged to store a plurality of sets of data, the data in each set identifying one or more frequencies, the method comprising: identifying at the receiving device a first frequency at which a signal having a pre-determined identifiable characteristic is received; identifying at the receiving device or the server a set containing data identifying the first frequency; and extracting at the receiving device or the server other data from said identified set.

According to a second aspect of the invention, there is provided a receiving device for use in a network in which signals are transmitted at a plurality of different frequencies, the receiving device including memory arranged to store a plurality of sets of data, the data in each set identifying one or more frequencies, the receiving device being configured to: identify a first frequency at which a signal having a pre-determined identifiable characteristic is received; identifying a set containing data identifying the first frequency; and extract other data from said identified set. According to a third aspect of the invention, there is provided a server for use with a receiving device operable in a network in which signals are transmitted at a plurality of different frequencies, the server including memory arranged to store a plurality of sets of data, the data in each set identifying one or more frequencies, the server being responsive to receiving a signal identifying a first frequency at which a signal is received at a receiving device to identify a set containing data identifying the first frequency; and to send other data from said identified set or data derived therefrom to the receiving device.

The invention allows a receiving device to determine or be informed of what frequencies signals are transmitted on locally without needing to perform a full signal scan.

Embodiments of the present invention will now be described, by way of example, with reference to the accompanying drawings.

DETAILED DESCRIPTION OF THE EMBODIMENTS

Figure 1:
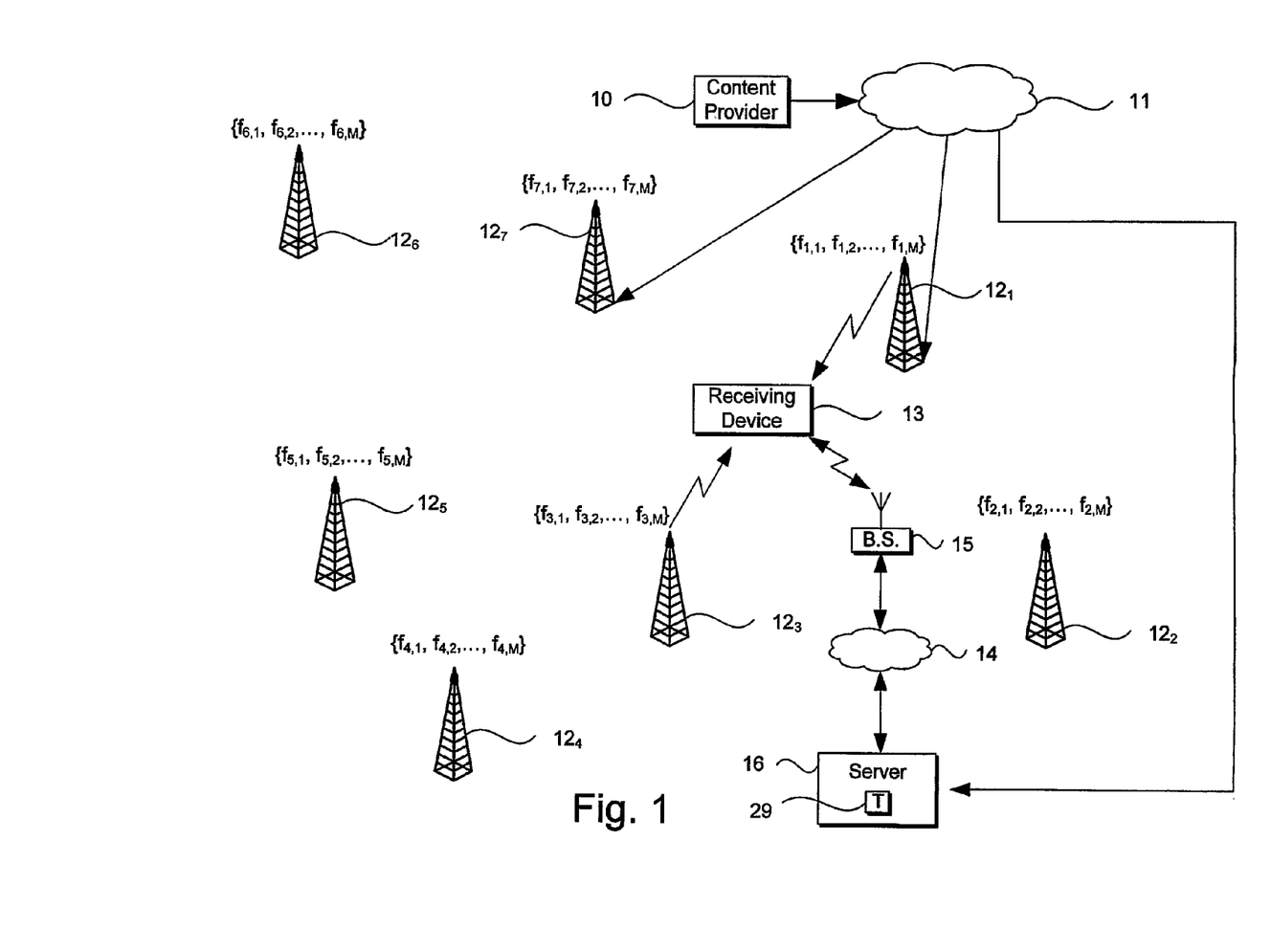
FIG. 1 illustrates a broadcast network including a receiving device and a plurality of transmitters, and a mobile telephone network.

Referring to FIG. 1, a broadcast radio network including a service provider 10, a network 11, a plurality of transmitters $12_1$, $12_2$, $12_3$, $12_4$, $12_5$, $12_6$, $12_7$ and a receiving device 13 is shown.

The broadcast network is a terrestrial digital video broadcasting (DVB-T) or handheld digital video broadcasting (DVB-H) network. However, the network may be an analogue TV, frequency modulation (FM) radio, radio data system (RDS), digital audio broadcast (DAB), integrated services digital broadcasting (ISDB-T), advanced television systems committee (ATSC), satellite digital video broadcasting (DVB-S), multimedia broadcast multicast service MBMS), Digital Multimedia Broadcasting (DMB), 'Forward Link Only' (FLO) or any other type of broadcast network. Optionally, the network may be a bi-directional network, such as a global system for mobile communications (GSM), wideband code division multiple access (WCDMA) or code division multiple access (CDMA) network.

The content provider 10 may be a television or radio broadcaster for instance.

The network 11 is arranged to communicate content provided by the content provider 10 to the transmitters.

The plurality of transmitters $12_1$, $12_2$, $12_3$, $12_4$, $12_5$, $12_6$, $12_7$ are disposed for radio communication with a receiving device 13. Not all transmitters $12_1$, $12_2$, $12_3$, $12_4$, $12_5$, $12_6$, $12_7$ are necessarily in radio contact with the receiving device simultaneously. This is because the receiving device 13 is located outside of the range of one or more transmitters, for example transmitters $12_2$ and $12_6$. Each transmitter $12_1$, $12_2$, $12_3$, $12_4$, $12_5$, $12_6$, $12_7$ transmits a signal carrying a first television channel at a respective first frequency $f_{1,1}$, $f_{2,1}$, $f_{3,1}$, $f_{4,1}$, $f_{5,1}$, $f_{6,1}$, $f_{7,1}$. The transmitters $12_1$, $12_2$, $12_3$, $12_4$, $12_5$, $12_6$, $12_7$ also transmit a signal carrying a second television channel at a respective second frequency $f_{1,2}$, $f_{2,2}$, $f_{3,2}$, $f_{4,2}$, $f_{5,2}$, $f_{6,2}$, $f_{7,2}$. In general, an i-th transmitter $12_i$ transmits a signal carrying a j-th television channel at a respective j-th frequency $f_{i,j}$. Although seven transmitters $12_1$, $12_2$, $12_3$, $12_4$, $12_5$, $12_6$, $12_7$ have been shown in FIG. 1, the network can include any number of transmitters. The transmitters may instead be divided between two or more networks of the same or a similar type.

In this example, each frequency is different. However, one or more of the frequencies may be the same. The transmitters $12_1$, $12_2$, $12_3$, $12_4$, $12_5$, $12_6$, $12_7$ are disposed so as to provide reasonable coverage of a given area and to minimise signal interference.

The receiving device 13 is operable to communicate using a mobile telephone network 14 through a base station 15. A server 16 is connected to both of the mobile telephone network 14 and the broadcast network 11.

Figure 2:
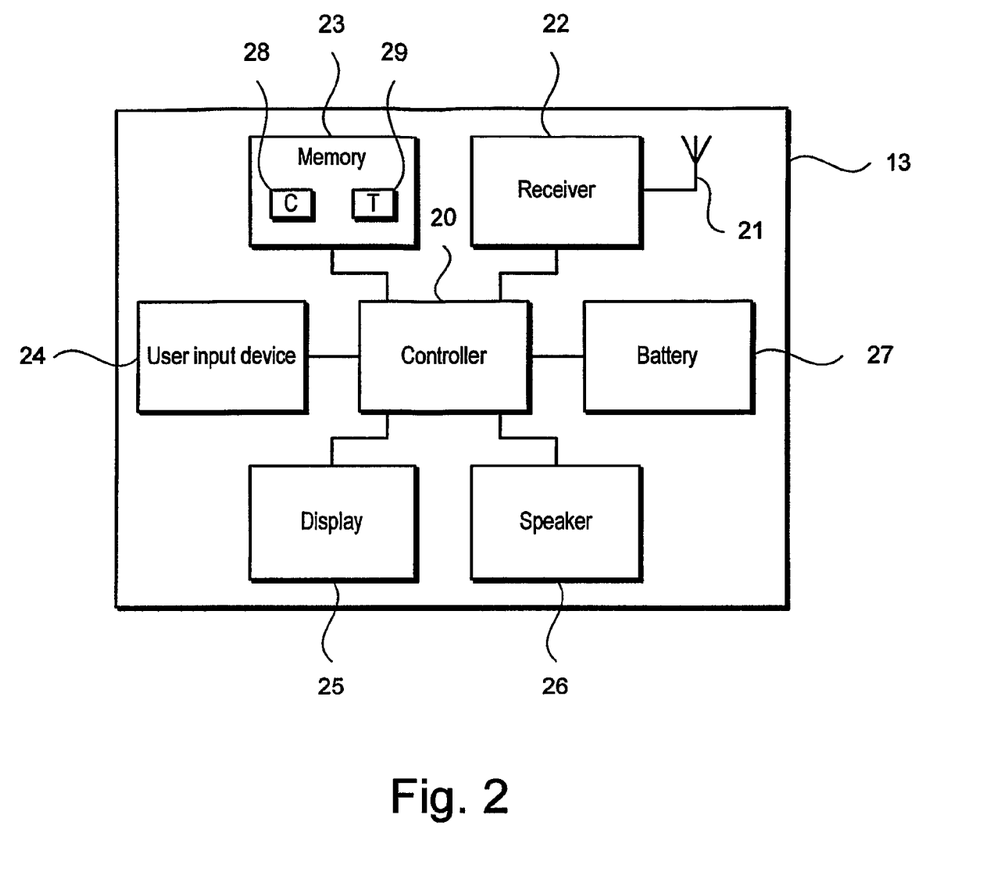
FIG. 2 is a schematic diagram of a receiving device in accordance with the present invention.

Referring to FIG. 2, a schematic diagram of a receiving device 13 in accordance with the present invention is shown. The receiving device 13 includes a controller 20, an antenna 21, a receiver 22, a memory 23, a user input device 24, a display 25, a speaker 26 and a battery 27. The memory 23 stores a computer program 28 and a table 29.

The receiving device 13 may be a mobile or cellular phone. However, the receiving device 13 may instead be a personal digital assistant (PDA), a laptop or notebook computer, a portable music player or another suitable receiving device.

In this embodiment of the invention, the controller 20 is in the form of a microprocessor. More than one microprocessor may be used. In other embodiments, the controller may include one or more Application Specific Integrated Circuits (ASICs) and/or other microelectronic chips.

The antenna 21 is internal to the receiving device 13. However, the antenna 21 may be external to the receiving device 13. The antenna 21 may be removably attached to the receiving device 13. The receiving device 13 may also include a transmitter (not shown). The receiver 21 and transmitter (not shown) may be provided in the form of a transceiver (not shown).

The memory 23 is in the form of a solid-state memory device. However, other types of storage may be used, such as an optical disk drive and/or a hard disk drive. The memory 23 may be disposed on a removable Subscriber Identity Module (SIM) card. The memory 23 may comprise plural devices and may include at least one external, connectable device (not shown) and/or at least one internal, removable device (not shown).

The user input device 24 may include a keyboard, a touch screen, a jog wheel or a keypad, or any other suitable device.

More than one speaker 26 may be used, for example, for stereophonic output. One or more speakers 26 may be included in a headset (not shown) which is removably attached to the receiving device 13. The receiving device 13 may include a headphone jack (not shown) for mating with a headset (not shown), and in this case the receiving device 13 may not include the speaker 26.

The battery 27 is a rechargeable battery. Alternatively or additionally, the receiving device 13 may be removably connected to an external power supply (not shown). The receiving device 13 may include an internal recharging circuit (not shown) for recharging the battery 27.

A computer program 28 for execution by the controller 20 is stored in the memory 23.

A table 29 including a plurality of sets of data is stored in memory 23. The table 29 may be delivered to the receiving device 13 via a cellular network, announcements in a broadcast network, the Internet, the Wireless Applications Protocol (WAP) and/or a personal computer (PC). Some or all of the table 29 may be preloaded into the memory 23 during manufacturing.

Figure 3:
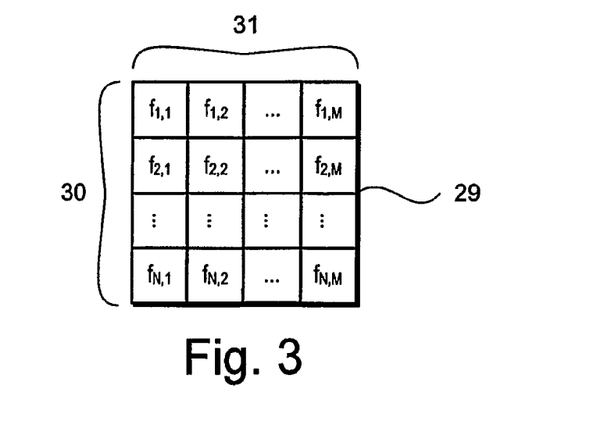
FIG. 3 shows a first table containing sets of data, the data in each set identifying one or more frequencies as used by apparatus according to the invention.

Referring to FIG. 3, a table 29 containing sets of data, the data in each set identifying one or more frequencies is shown.

In this example, the table 29 includes N rows 30 and M columns 31. The data in the cells of a given row 30 may represent frequencies transmitted in respect of a geographical region, by one transmitter or by plural transmitters in the same approximate location. One entry in a row 30, for example the leftmost cell, may carry data identifying the geographical region or transmitter(s), for example a name of the region or transmitter(s). The geographical regions and/or transmitter names may be in natural language form. The table 29 may be arranged so that the frequencies used in respect of a given television channel or bundle are in the same column 31. One entry in each column, for example the uppermost cell in the column, may carry an identification of the television channel or bundle, for instance a name of the television channel or bundle. The television channel or bundle names may be in natural language form. The table may have empty cells. The term 'television channel' is used in this specification to mean a broadband service or a service bundle comprising one or mote services, including 'ordinary' television programmes.

An entry $f_{i,j}$ in table 29 represents the frequency at which the i-th transmitter $12_i$ transmits a signal carrying the j-th television channel. For example, if the fourth transmitter $12_4$ transmits a signal carrying the third television channel at a frequency of 506 MHz, then $f_{4,3}$=506 MHz. Similarly, if the fourth transmitter $12_4$ transmits a signal carrying the fourth television channel at a frequency of 594 MHz, then $f_{4,4}$=594 MHz.

A frequency $f_{i,j}$ in table 29 may be represented by a channel number. For example, a channel frequency $f_{4,3}$=506 MHz may be represented by channel number "25" and a channel frequency $f_{4,4}$=594 MHz may be represented by channel number "36". However, a frequency $f_{i,j}$ may be represented by other data, such as an alphanumeric string or a frequency in a non-SI unit.

The data in the table 29 is not necessarily provided at the same time. For example, the table 29, or the data therein, may be modified or updated according to discovered data. Discovered data may include data derived from signals broadcast via the network 11. Discovered data may be stored in addition to preloaded data, i.e. data that was preloaded during manufacturing. Modifications and/or updates may be performed by a user. Alternatively or additionally, modifications and/or updates may be performed automatically, with or without user interaction or acceptance. Modifications and/or updates may in some embodiments of the invention also be downloaded via WLAN or Bluetooth access points. The received modifications and/or upgrades may comprise, for example, temporal and/or regional validity restrictions.

Some, or all, of the data in the table 29 may be preloaded in memory 23. Alternatively or additionally, some or all of the data in the table 29 may be transmitted to the receiving device 13 via the network 11 or via another network. Table 29 may be stored as two or more separate tables (not shown) or in a different database form, for example as a comma separated values (CSV) file.

Figure 4:
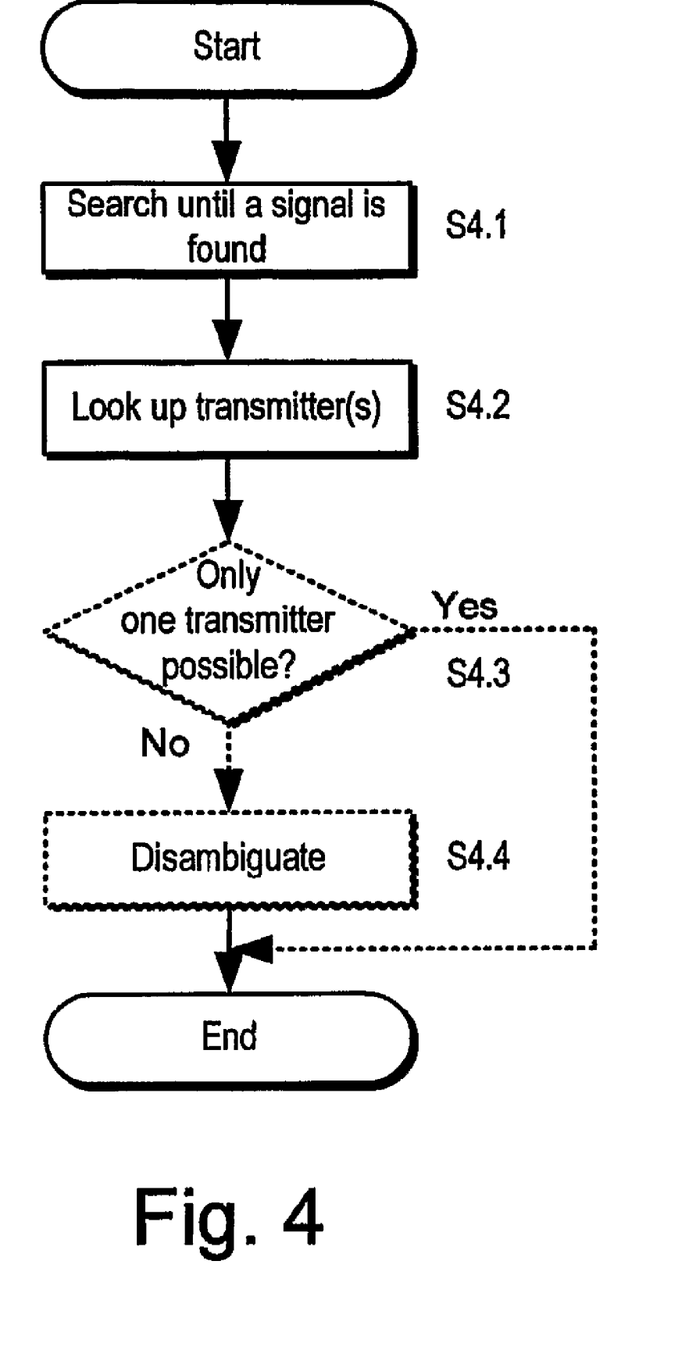
FIG. 4 is a process flow diagram of a method of identifying locally broadcast frequencies according to the present invention.

Referring still to FIG. 3 and also to FIG. 4, a method of identifying the frequencies at which broadcast services are provided by a transmitter local to the receiving device 13 is shown.

After operation start, a search is carried out until a signal is received by the receiving device 13 (step S4.1). This step may comprise an evaluation of the type of received signal, i.e. whether the found signal is a DVB-H signal or a signal of another suitable type. Then, the receiving device looks-up the transmitter (step S4.2). This involves searching the table 29 and identifying the row 30 that includes data corresponding to the frequency of the found signal. The process may then end. Optionally, it is determined whether or not there is only one candidate transmitter (step S4.3). This can involve determining how many rows 30 in the table 29 include data corresponding to the frequency of the found signal. If there is only one row, then the process ends. If there is more than one row, then the transmitter is disambiguated (Step s4.4) (in any suitable way). Following disambiguation, the process ends.

In one example, the search (step S4.1) reveals a signal. The signal may relate to a single radio or television channel, or to a bundle of channels. The signal has a first frequency. For example, the first frequency may be $f_{2,3}$. The first frequency $f_{2,3}$ is located in the second row, third column of table 29. This indicates that the signal originates from the second transmitter $12_2$. It identifies also that the signal carries the third television channel or bundle (step S4.2). If the first frequency $f_{2,3}$ is not found in any other row in the table 29, i.e. $f_{2,3} \neq f_{i,j}$ for all $i \in \{1, \ldots, N\} \backslash \{2\}$, the frequencies, and hence channel numbers, at which the second transmitter $12_2$ transmits each of the remaining television channels may be determined by reading along the second row of the table 29. Therefore, the receiving device 13 is provided with the frequencies at which broadcast services are provided by the second transmitter 12 without performing a full signal search at all of the remaining frequencies.

In some circumstances, it may be possible for the first frequency $f_{2,3}$ to be contained in one or mote rows of the table 29, i.e. $f_{2,3}=f_{i,j}$ for some $i \in \{1, \ldots, N\} \backslash \{2\}$. For example, if the second transmitter $12_2$ transmits the third television channel at the same frequency as that at which the first transmitter $12_1$ transmits the second television channel, then $f_{2,3}=f_{1,2}$. In this case, it may not be possible to determine whether the signal was transmitted by the first transmitter $12_1$ or the second transmitter $12_2$ based only on the frequency of the signal. Thus, if there is more than one possible transmitter 12 from which the signal was sent, it may be beneficial to disambiguate (step S4.4). Disambiguation involves tuning the receiving device 13 to a frequency which is broadcast by one of the possible transmitters, and excluding possible transmitters on the basis of whether or not a signal was found there until only one possible transmitter remains.

Figure 5:
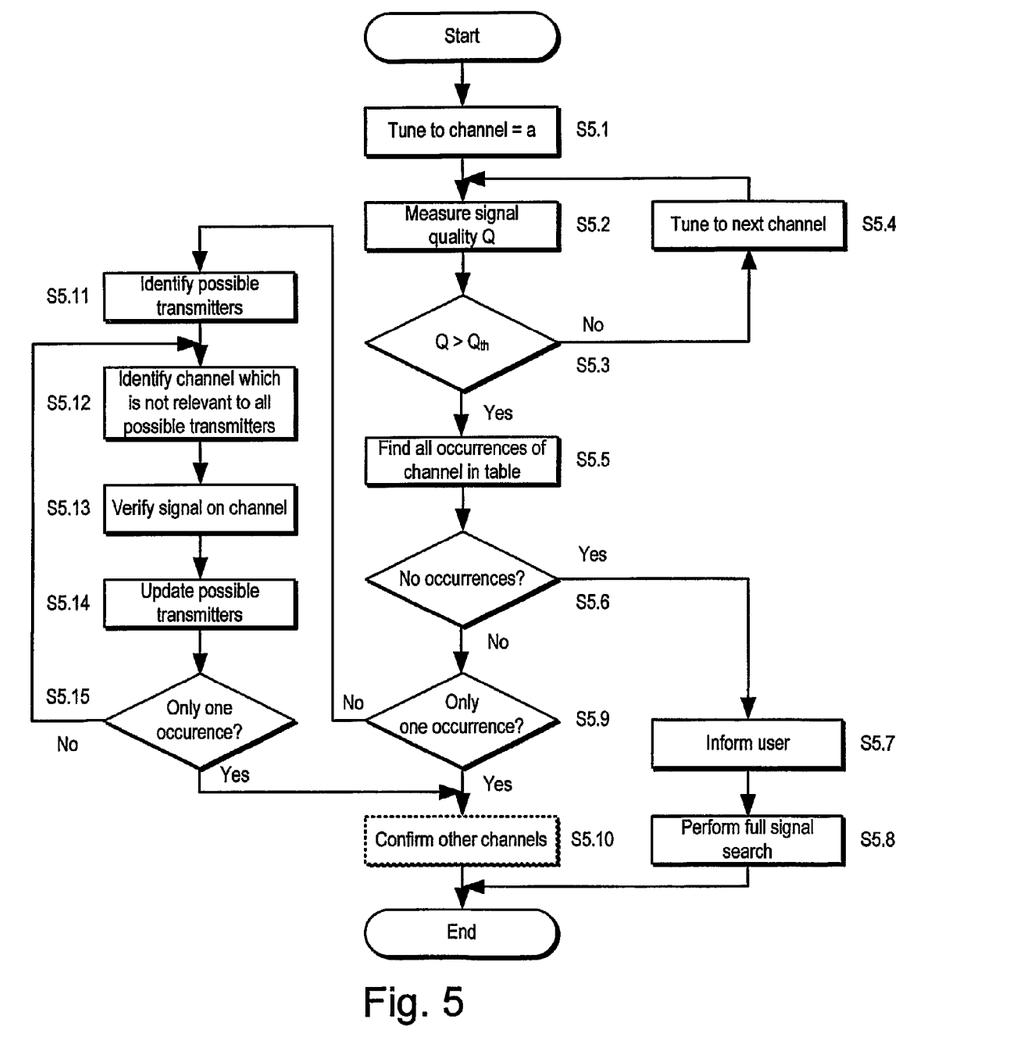
FIG. 5 is a process flow diagram of an alternative to the FIG. 4 method also according to the invention.

Referring to FIG. 5, an alternative method is shown.

The receiving device 13 commences at a first frequency, corresponding to a channel number "a" (step S5.1). The signal search may be initiated when the receiving device 13 is turned on, or upon receiving a command by a user to perform a signal search. Alternatively or additionally, the signal search may be initiated when the receiving device 13 no longer receives a signal of sufficiently high quality from a given transmitter 12. The receiving device 13 performs the signal search by tuning to the lowest frequency, or channel number, found in the table 29. Alternatively, the signal search may be performed by tuning to the highest frequency, or channel number, found in the table 29. Alternatively, the search may be performed by tuning to a predefined channel number, for example channel number "10". Preferably, the predefined channel number is one included in the table 29.

The search may be performed by tuning to the channel corresponding to the frequency of the most recently received, highest quality or most often received signal. A hierarchical list (not shown) of the most recently received, highest quality or most often received signals may be stored in the memory 23. The channel number "a" at which the signal search is commenced may be chosen in any other suitable manner.

The receiving device 13 is tuned to the first frequency. The first frequency corresponds to channel number "a". If a signal is found, a pre-determined identifiable characteristic, in this example signal quality, Q, is measured. The signal quality Q may be a measure of signal-to-noise ratio or bit error rate. The pre-determined identifiable characteristic may be any other suitable identifiable characteristic of the signal. The signal may relate to a single radio or television channel, or to a bundle of channels. If no signal is found, then Q is zero.

The receiving device 13 determines the signal quality Q of the received signal (step 5.2). The receiving device 13 determines whether the signal quality Q of the received signal is greater than a threshold value, $Q_{th}$, (step S5.3). The threshold value $Q_{th}$ may be preloaded into the memory 23 or may be delivered to the receiving device 13 via a cellular network, announcements in a broadcast network, the Internet, WAP or a PC.

If the signal quality Q of the received signal is less than or equal to the threshold value $Q_{th}$, the receiving device 13 determines that the signal quality Q of the received signal is not sufficiently high and tunes to the next channel number (step S5.4).

The next channel number is the one immediately following the former channel number. Thus, if the channel number is 2, the next channel number is "3".

The next channel number may be chosen in other ways. The next channel number may be the channel number preceding the former channel number. For example, if the channel number is "54", the next channel number could be "53". The channel number may be incremented in different step sizes. The next channel number may be selected according to a hierarchical list of channel numbers corresponding to the most recently received, highest quality or most often received signal. The hierarchical list may be stored in memory 23.

When the signal quality Q of a received signal is greater than the threshold value $Q_{th}$, the receiving device 13 finds all occurrences of the frequency of the received signal, by corresponding channel number, in the table 29 (step S5.5).

If there are no occurrences, the user is informed (steps S5.6 and S5.7). After the user is informed, a full signal search is performed (step S5.8).

If there is at least one occurrence of the channel number in the table 29, the receiving device 13 determines the number of occurrences of the channel number in the table 29 (step S5.9).

If there is more than one occurrence of the relevant channel number in the table 29, the receiving device 13 identifies the rows in table 29 in which the relevant channel number is found (step S5.9 and S5.11). A candidate list of rows in which the relevant channel number is found is compiled.

A further channel number "b" which is found in at least one, but not all, of the candidate tows is identified (step S5.12). Preferably, the further channel number "b" is contained in only one of the candidate rows.

The receiving device 13 then verifies whether a signal is found on the further channel number "b" (step S5.13). If a signal is found on the further channel number "b", any candidate rows not containing further channel number "b" are eliminated (step S5.14). If no signal is found on the further channel number "b", any candidate tows containing the further channel number "b" are eliminated (step S5.14).

If step S5.14 does not result in only one possible candidate row, the receiving device 13 then tunes to an additional further channel number "c" and detects whether a signal is present there (steps S5.15 and S5.12). This continues until only one candidate row remains.

When only one candidate row remains, either from step S510 or from step S5.15, the receiving device 13 optionally confirms whether signals are received on the remaining channel numbers, i.e. the channel numbers that are present in the candidate row and that have not been verified as having a signal (step S5.10 and S5.15).

Figure 6:
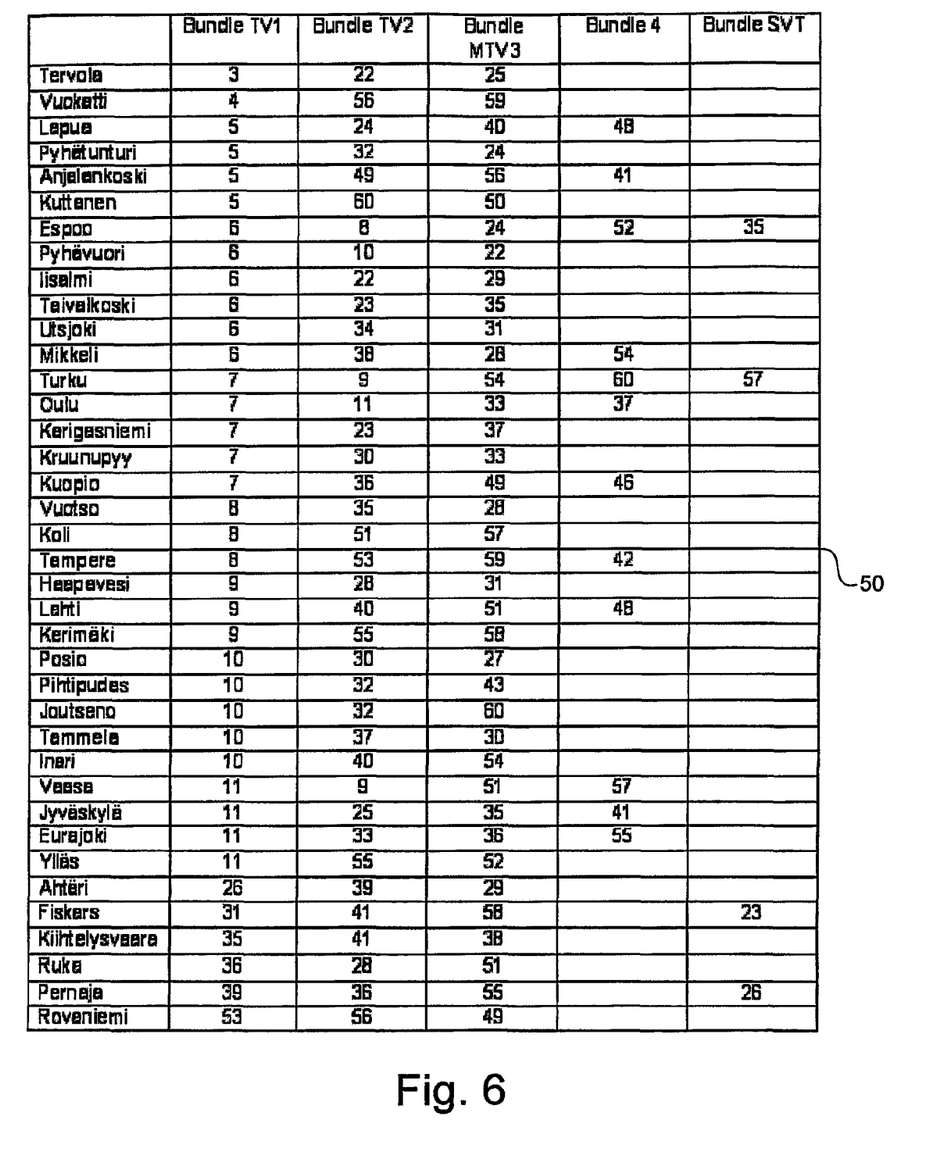
FIG. 6 shows a second table containing sets of data, the data in each set identifying one or more frequencies.

Reference is now made also to FIG. 6, which shows a table 50 containing sets of data, in which the data in each set identifies one or more frequencies.

The receiving device 13 stores the table 50, and performs the method of FIG. 5 with reference to the table 50.

Step S5.4 may be intelligent, based on information in the table 50. For instance, if the next channel number is not found in the table 29, the channel number is incremented until the next channel number is found in the table 29 before any retuning is carried out. For example, referring to table 50, if the channel number is "11", the next channel number is "22" since channel number "12" is not found in the table 50. The channel number "a" is incremented until it reaches the highest channel number in the table 29. In this case, tuning to the next channel number includes tuning to the lowest channel number found in the table 50. For example, referring to table 50, if the channel number is "59", the next channel number is "60", which is found in the table 50. However, if the channel number is "60", the highest channel number, the next channel number is "3", which is the lowest channel number.

In one example, step S5.3 finds a sufficiently high-quality signal at a frequency corresponding to channel number "3". Since channel number "3" is contained in only one row in the table 50 (the row labelled "Tervola") the receiving device 13 determines that the received signal was transmitted from Tervola. The receiving device 13 then extracts the remaining channel numbers "22" and "25" from the "Tervola" row. No further signal search is required. The remaining channel numbers may be confirmed at step S5.10.

In another example, a sufficiently high-quality signal is received on channel number "10". Since channel number "10" is contained in more than one row in the table 50, the receiving device 13 determines the tows in which channel number "10" is contained. A candidate list of six possible transmitters, Posio, Pihtipudas, Pyhävuoti, Joutseno, Tammela and Inari is compiled at step S5.11. The receiving device 13 identifies a channel number which is not found in all of the candidate tows in this example, channel number "37". If a sufficiently high quality signal is received at a frequency corresponding to channel number "37", the receiving device 13 infers that the signal was transmitted from Tammela. In this case, the remaining channel number "30" is extracted from the "Tammela" row, and optionally confirmed at step S5.10. If at step S5.12, channel number "32" is identified, the identified channel number is found in two candidate tows, namely Pihtipudas and Joutseno. Thus, if a signal is found on channel number "32", an additional further signal is required. If a signal is received at a frequency corresponding to channel number "60", then the only possibility is that the signal was transmitted from Joutseno. If no signal is received at this frequency, the only possibility is that the signal was transmitted from Pihtipudas. In either case, the remaining channel numbers are extracted.

In some embodiments of the invention, the bundle that the received signal carries can be determined from the received signal. For example, a signal may carry a bundle identifier which identifies which bundle it relates to. In this way, it is possible for the receiving device 13 to use the bundle information to differentiate between different transmitter locations that transmit on the some or all of the same channel numbers. Thus, even if two transmitters use the same set of frequencies or the same set of frequencies are used in two or more regions, a receiving device 13 can differentiate between them.

Once the transmitter that the receiving device 13 is receiving from has been identified, an approximate location of the user can be deduced, particularly if a frequency plan is available for the user.

In a further example, a sufficiently high-quality signal is received at a frequency corresponding to channel number "12" at steps S5.1, S5.2 and S5.3. Channel number "12" is not found in the table 50. No other signals are received at frequencies corresponding to any of the channel numbers found in the table 50. The receiving device 13 does not find channel number "12" in the table 50 and, thus, does not determine the transmitter from which the signal was sent. In this example, the user is informed and a full signal search is performed.

Once the frequencies at which the local transmitter broadcasts on are obtained from the table, this information is stored by the receiving device 13 in a suitable way. The receiving device 13 then is able to use this information to retune to the other available television or radio channels or bundles of channels which are available from the local transmitter without performing any additional searching. The additional frequencies may be tuned to by the receiving device 13 for example following the user selecting a "channel up" or "channel down" option, or accessing a service included in an electronic program guide or similar.

A user may be informed on the progress of a signal search by the receiving device 13 displaying a series of icons in the display 25. For example, a red icon is displayed when the search is started. A yellow icon is displayed when a signal at a first frequency is found. When the search is completed, a green icon is displayed. The red and yellow icons may be displayed simultaneously. The yellow and green icons may be displayed simultaneously. Other colours may be used. Alternatively or additionally, text may be displayed to indicate the process of the signal search. The icons may be images. A "progress" sound may be outputted via the speaker 26 at intervals during the search.

The table 50 may be updatable by the receiving device 13 after the table 50 has been initially installed. Updating may comprise supplementing the table with additional rows, for instance relating to new transmitters within the network or with transmitters in one or more further networks which are visited by the receiving device. Updating may alternatively or in addition comprise modifying existing entries, for instance deleting frequencies that a transmitter no longer uses and/or adding new frequencies as they are added to a transmitter.

The table may be updated manually by a user.

Alternatively, updating may be performed automatically. A list of transmitters that provide DVB-H services/television channels can be found in received TPS bits. If bit s48 is "1", then it is known that at least one elementary stream uses time-slicing. DVB-H networks can broadcast a Network Information Table (NIT), that includes information on particular network. NITs are updated at intervals of less than ten seconds. The NIT may include data on other available networks. However, an NIT does not give complete information on the availability of services. Automatic updating of the table may utilise information from a received NIT.

The transmitters can be part of a single frequency network (SFN), in which several adjacent transmitters transmit at the same frequency, on a time-divided basis. In this case, information solely identifying a channel number corresponding to a frequency at which a signal is found to be present may provide a candidate list which is not much shorter than the candidate list before that signal was processed by the FIG. 5 flow chart. Where the receiving device 13 is operable in an SFN, some modifications may be beneficial. In particular, the table 50 can be extended to include timing information as well as frequency information, and the FIG. 5 flow chart in this case is modified to require that the timing of a received signal is consistent with the timing information and the channel number before determining that a received signal matches data forming part of a set in the table 50.

It will be apparent that many modifications may be made to the embodiments hereinbefore described. For example, in another embodiment, the table 29 may not be stored in the memory 23. For example, the table 29 may be stored at the server 16. The table 29 in the server 16 may be updated by way of a connection to the network 11. In this example, the receiving device 13 determines the frequency or channel number of a received signal and informs the server 16. In this example, the receiving device 13 determines the frequency or channel number of a received signal and informs the server 16, the server 16 informs the receiving device 13 of some or all of the remaining channel numbers in that row. If the channel number is found in more than one row, any suitable disambiguation may be required to eliminate some of the rows. In this case, the server informs the receiving device 13 of the frequencies, or channel numbers, at which the receiving device 13 should look for a signal. Disambiguation may be performed by the server 16, with the receiving device 13 informing the server 16 at which frequencies signals were found. Alternatively, disambiguation may be performed at the receiving device 13. In this case, the server 16 may send data relating to the candidate list of transmitters to the receiving device 13, with the receiving device 13 performing the remaining actions needed to complete disambiguation.

The invention claimed is:

1. A method comprising:
    operating a receiving device in a network in which signals are broadcast at a plurality of different frequencies, the receiving device or a server including memory configured to store a plurality of sets of data, the data in each set identifying one or more frequencies at which a signal may be broadcast within the network;
    identifying at the receiving device a first frequency at which a signal with a signal quality exceeding a threshold is received;
    at the receiving device determining from the signal received at the first frequency a bundle identifier which identifies a bundle to which the received signal at the first frequency relates;
    identifying at the receiving device or the server two or more sets containing data identifying the first frequency, wherein each of the two or more sets also identifies a respective bundle carried on signals at the first frequency;
    using the received bundle identifier and the information in the sets of data to disambiguate between the identified two or more sets of data such as to provide a single candidate set of data; and
    extracting at the receiving device or the server other data from said single candidate set of data.

2. A method according to claim 1, comprising storing the plurality of sets of data in the memory of the receiving device before the receiving device performs identifying at the receiving device or the server two or more sets containing data identifying the first frequency and the extracting step.

3. A method according to claim 1, comprising storing the plurality of sets of data in the server and sending the other data or data derived therefrom to the receiving device before the server performs identifying at the receiving device or the server two or more sets containing data identifying the first frequency and the extracting step.

4. A method according to claim 1, wherein extracting comprises extracting all data from said single candidate set of data.

5. A method according to claim 1, wherein using also comprises tuning the receiving device to a further frequency identified by the data in one or more of the two or more sets, and eliminating one or more of the two or more sets on the basis of whether a signal is found at the further frequency.

6. A method according to claim 5, comprising repeating tuning and eliminating in respect of further frequencies until the single candidate set of data remains.

7. A method according to claim 1, comprising supplementing, modifying or updating said plurality of sets of data according to data derived from signals broadcast via the network.

8. A computer program embodied on a non-transitory computer medium, the computer program comprising instructions which, when executed by a computer, causes said computer to perform the method according to claim 1.

9. A computer program product comprising a non-transitory computer readable medium storing a computer program according to claim 8.

10. An apparatus comprising:
a receiving device configured for use in a network in which signals are broadcast at a plurality of different frequencies, the receiving device including memory configured to store a plurality of sets of data, the data in each set identifying one or more frequencies at which a signal may be broadcast within the network, the receiving device including a controller configured to:
identify a first frequency at which a signal with a signal quality exceeding a threshold is received;
determine from the signal received at the first frequency a bundle identifier which identifies a bundle to which the received signal at the first frequency relates;
identify two or more sets containing data identifying the first frequency, wherein each of the two or more sets also identifies a respective bundle carried on signals at the first frequency;
use the received bundle identifier and the information in the sets of data to disambiguate between the identified two or more sets of data such as to provide a single candidate set of data; and
extract other data from said single candidate set of data.

11. An apparatus according to claim 10, wherein the controller is configured to extract all data from said single candidate set of data.

12. An apparatus according to claim 10, wherein the controller is configured to disambiguate between the identified two or more sets of data by tuning to a further frequency identified by the data in one or more of the two or more sets, and to eliminate one or more of the two or more sets on the basis of whether a signal is found at the further frequency.

13. An apparatus according to claim 12 wherein the controller is configured to repeat the tuning step in respect of further frequencies until only the single candidate set of data remains.

14. An apparatus according to claim 10 wherein the controller is configured to supplement or modify or update said plurality of sets of data according to data derived from signals broadcast via the network.

15. An apparatus comprising:
a server configured for use with a receiving device operable in a network in which signals are broadcast at a plurality of different frequencies, the server including memory configured to store a plurality of sets of data, the data in each set identifying one or more frequencies at which a signal may be broadcast within the network, the server being responsive to
receive a signal identifying a first frequency at which a signal with a signal quality exceeding a threshold is received at the receiving device;
receive from the receiving device a bundle identifier which identifies a bundle to which the signal received at the first frequency at the receiving device relates;
identify two or more sets containing data identifying the first frequency, wherein each of the two or more sets also identifies a respective bundle carried on signals at the first frequency;
use the received bundle identifier and the information in the sets of data to disambiguate between the identified two or more sets of data such as to provide a single candidate set of data; and
to send other data from said single candidate set of data or data derived therefrom to the receiving device.

16. An apparatus according to claim 15, wherein the server is configured to extract all data from said single candidate set of data.

* * * * *